United States Patent
DeCamp et al.

(10) Patent No.: US 7,093,212 B2
(45) Date of Patent: Aug. 15, 2006

(54) IC DESIGN DENSITY CHECKING METHOD, SYSTEM AND PROGRAM PRODUCT

(75) Inventors: William F. DeCamp, Williston, VT (US); Daniel J. Nickel, Westford, VT (US)

(73) Assignee: International Business Machines Corporation, Armonk, NY (US)

(*) Notice: Subject to any disclaimer, the term of this patent is extended or adjusted under 35 U.S.C. 154(b) by 369 days.

(21) Appl. No.: 10/708,820

(22) Filed: Mar. 26, 2004

(65) Prior Publication Data

US 2005/0216870 A1   Sep. 29, 2005

(51) Int. Cl.
*G06F 17/50* (2006.01)

(52) U.S. Cl. ............................... 716/4; 716/5; 716/716; 716/19

(58) Field of Classification Search ................. 716/4–5, 716/19
See application file for complete search history.

(56) References Cited

U.S. PATENT DOCUMENTS

| 6,134,702 | A | 10/2000 | Scepanovic et al. |
| 6,189,130 | B1 | 2/2001 | Gofman et al. |
| 6,493,658 | B1 | 12/2002 | Koford et al. |
| 6,735,749 | B1 * | 5/2004 | Li et al. ........................ 716/5 |
| 2002/0066064 | A1 | 5/2002 | Kamath et al. |
| 2002/0170031 | A1 * | 11/2002 | Yamada et al. ............... 716/19 |
| 2003/0196181 | A1 * | 10/2003 | Sano et al. .................... 716/4 |
| 2003/0229868 | A1 * | 12/2003 | White et al. ................... 716/5 |
| 2004/0153979 | A1 * | 8/2004 | Chang ............................ 716/4 |

FOREIGN PATENT DOCUMENTS

JP   2003067441 A   3/2003

* cited by examiner

*Primary Examiner*—Paul Dinh
(74) *Attorney, Agent, or Firm*—Richard M. Kotulak; Hoffman, Warnick & D'Alessandro LLC

(57) ABSTRACT

A system, method and program product for performing density checking of an IC design. The invention establishes an evaluation array for the IC design including an array element for each evaluation window of the IC design. The number of evaluation windows is based on a smallest necessary granularity. A single pass through shape data for the IC design is then conducted to populate each array element with a shape area for a corresponding evaluation window. Density checking is performed by iterating over the evaluation array using a sub-array. The sub-array may have the size of the preferred density design rule window. The invention removes the need for repetitive calculations, and results in a more efficient approach to density checking.

20 Claims, 4 Drawing Sheets

IC DESIGN DENSITY CHECKING METHOD, SYSTEM AND PROGRAM PRODUCT

BACKGROUND OF INVENTION

1. Technical Field

The present invention relates generally to design rule checking for very large scale integrated (VLSI) circuit layouts. More particularly, the present invention relates to a more efficient density checking method, system and program product for VLSI circuit layouts.

2. Related Art

Very large scale integrated (VLSI) circuit layouts are designed using computer-implemented design systems that allow a designer to generate and physically verify (test) a circuit design before the more expensive manufacturing of the integrated circuit (IC). In order to ensure proper design of an IC, each design system and/or IC format includes a set of design rules that each circuit design must meet. That is, each IC design must pass a design rule check (DRC). One fundamental operation of DRC is density checking. Density checking determines whether design shapes of an IC meet a specific density parameter to ensure, for example, the IC meets desired compactness goals, or enables planarization of the wafer, which allows finer lithography and, provides localized loading during etch operations, thus allowing improved yields.

Density checking is one of the more common design rule checks. As shown in FIG. 1, a standard density checking approach evaluates a section 12 of a target level of an IC design 14 using a window 20. Window 20 is sized to accommodate design rule requirements, which are typically based on a certain area. For example, one common density design rule bases density evaluation on a 25×25 μm window granularity requirement. To evaluate an entire IC design 14, the conventional approach finds all shapes on the target level in window 20, calculates a density for the entire window 20 and then compares the calculation to density design rule limits. A window 20 that includes a violation triggers an error. The process then repeatedly moves window 20 by intervals (e.g., of 3 μm), and calculates density for the entire window 20 at each interval until the entire IC design 14 is considered. No data is saved from each calculation.

Since window 20 is significantly larger than the moving interval (e.g., 3 μm), each new placement of window 20 overlaps a significant portion of its previous location. As a result, analysis of an IC design 14 includes a large number of redundant density calculations. The repetitive calculations are accepted as part of the density checking because it ensures that the desired granularity (25×25 μm) requirement of the density design rule is achieved. Unfortunately, the repetitive calculations also make density checking one of the most time-consuming and resource intensive processes of physical verification of IC designs.

In view of the foregoing, there is a need in the art for a method of checking IC design density that does not suffer from the problems of the related art.

SUMMARY OF INVENTION

The invention includes a system, method and program product for performing density checking of an IC design. The invention establishes an evaluation array for the IC design including an array element for each evaluation window of the IC design. The number of evaluation windows is based on a smallest necessary granularity. A single pass through shape data for the IC design is then conducted to populate each array element with a shape area for a corresponding evaluation window. Density checking is performed by iterating over the evaluation array using a sub-array. The sub-array may have the size of the preferred density design rule window. The invention removes the need for repetitive calculations, and results in a more efficient approach to density checking.

A first aspect of the invention is directed to a method for performing density checking on an integrated circuit (IC) design, the method comprising the steps of: establishing an evaluation array including an array element for each evaluation window of the IC design, wherein a number of evaluation windows is based on a smallest necessary granularity; performing a single pass through shape data for the IC design to populate each array element with a shape area of a corresponding evaluation window; and performing density checking by iterating over the evaluation array using a sub-array.

A second aspect of the invention is directed to a system for performing density checking on an integrated circuit (IC) design, the system comprising: means for establishing an evaluation array including an array element for each evaluation window of the IC design, wherein a number of evaluation windows is based on a smallest necessary granularity; means for performing a single pass through shape data for the IC design to populate each array element with a shape area therein; and means for performing density checking by iterating over the evaluation array using a sub-array.

A third aspect of the invention is directed to a computer program product comprising a computer useable medium having computer readable program code embodied therein for performing density checking on an integrated circuit (IC) design, the program product comprising: program code configured to establish an evaluation array including an array element for each evaluation window of the IC design, wherein a number of evaluation windows is based on a smallest necessary granularity; program code configured to perform a single pass through shape data for the IC design to populate each array element with a shape area therein; and program code configured to perform density checking by iterating over the evaluation array using a sub-array.

The foregoing and other features of the invention will be apparent from the following more particular description of embodiments of the invention.

BRIEF DESCRIPTION OF DRAWINGS

The embodiments of this invention will be described in detail, with reference to the following figures, wherein like designations denote like elements, and wherein.

DETAILED DESCRIPTION

Figure 1:
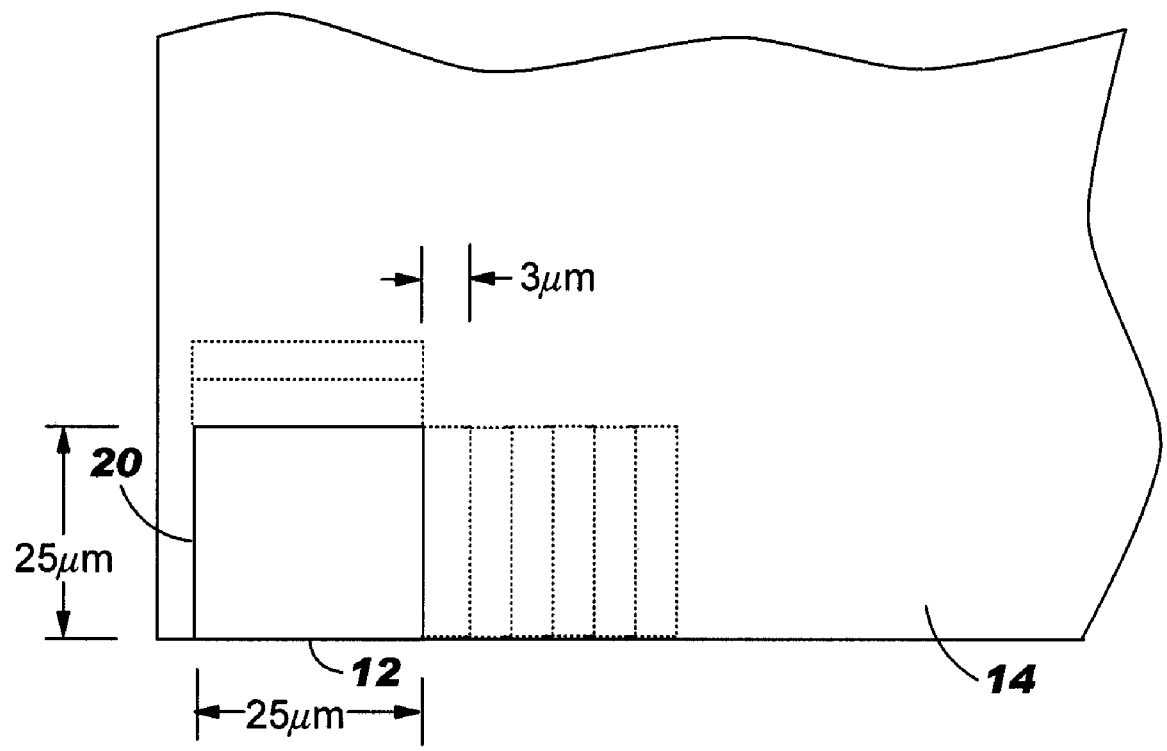
FIG. 1 shows a conventional approach for density checking an IC design.
Figure 2:
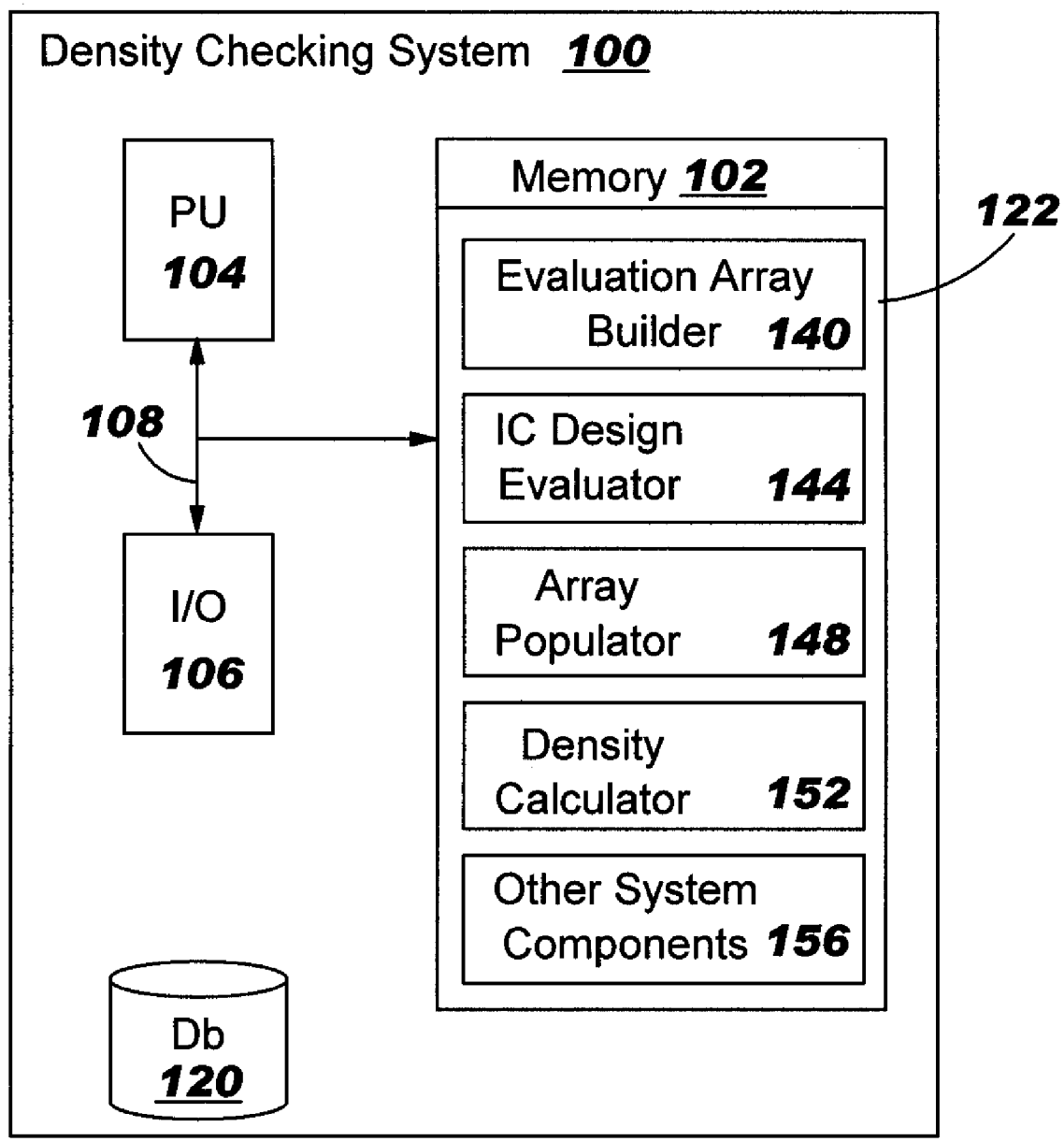
FIG. 2 shows a density checking system according to the invention.

With reference to the accompanying drawings, FIG. 2 is a block diagram of a density checking system 100 in accordance with the invention. Density checking system 100 includes a memory 102, a processing unit (PU) 104, input/output devices (I/O) 106 and a bus 108. A database 120 may also be provided for storage of data relative to processing tasks. It should be recognized that even though density checking system 100 will be described in terms of a separate system, the teachings of the invention are equally applicable where system 100 is part of a larger IC design system (not shown).

Memory 102 includes a program product 122 that, when executed by PU 104, comprises various functional capabilities described in further detail below. Memory 102 (and database 120) may comprise any known type of data storage system and/or transmission media, including magnetic media, optical media, random access memory (RAM), read only memory (ROM), a data object, etc. Moreover, memory 102 (and database 120) may reside at a single physical location comprising one or more types of data storage, or be distributed across a plurality of physical systems. PU 104 may likewise comprise a single processing unit, or a plurality of processing units distributed across one or more locations. I/O 106 may comprise any known type of input/output device including a network system, modem, keyboard, mouse, scanner, voice recognition system, CRT, printer, disc drives, etc. Additional components, such as cache memory, communication systems, system software, etc., may also be incorporated into system 100.

As shown in FIG. 2, program product 122 may include an evaluation array establisher 140, an IC design evaluator 144, an array populator 148, a density calculator 152 and other system components 156. Other system components 156 may include any other function necessary for implementation of density checking system 100 not explicitly described herein.

Figure 3:
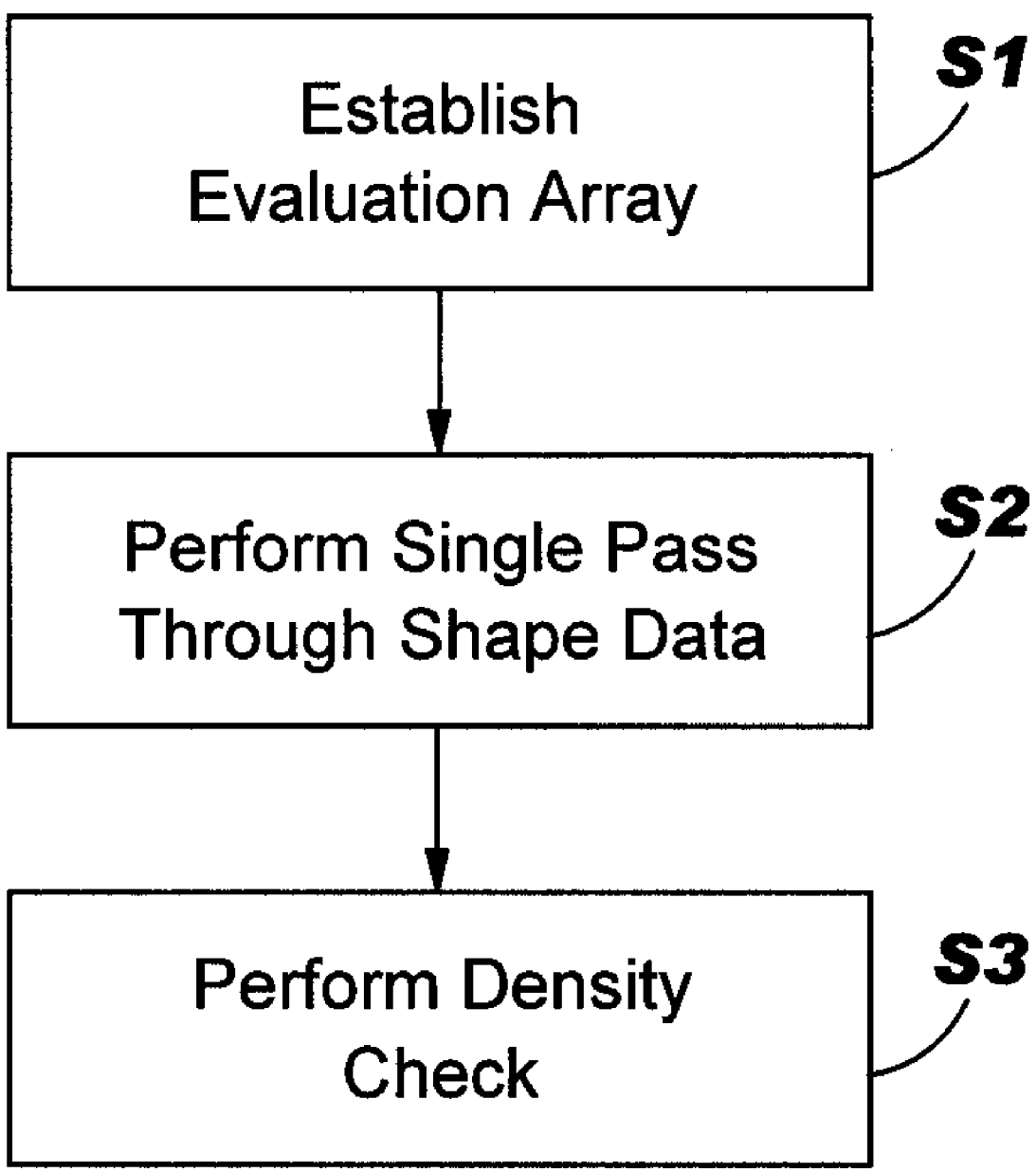
FIG. 3 shows a flow diagram of operation of the system of FIG. 2.
Figure 4:
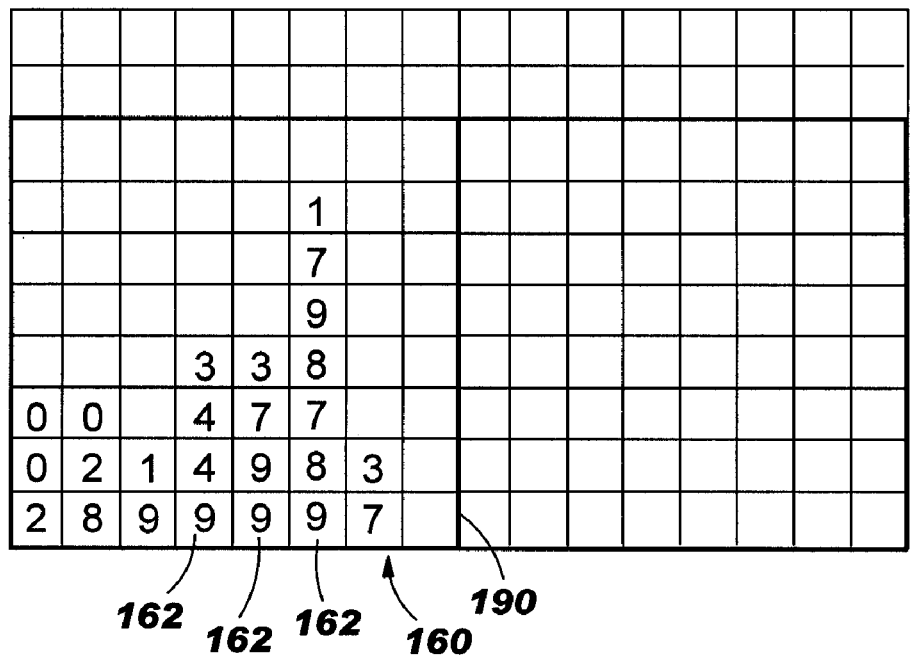
FIG. 4 shows establishment of an evaluation array for an IC design.
Figure 5:
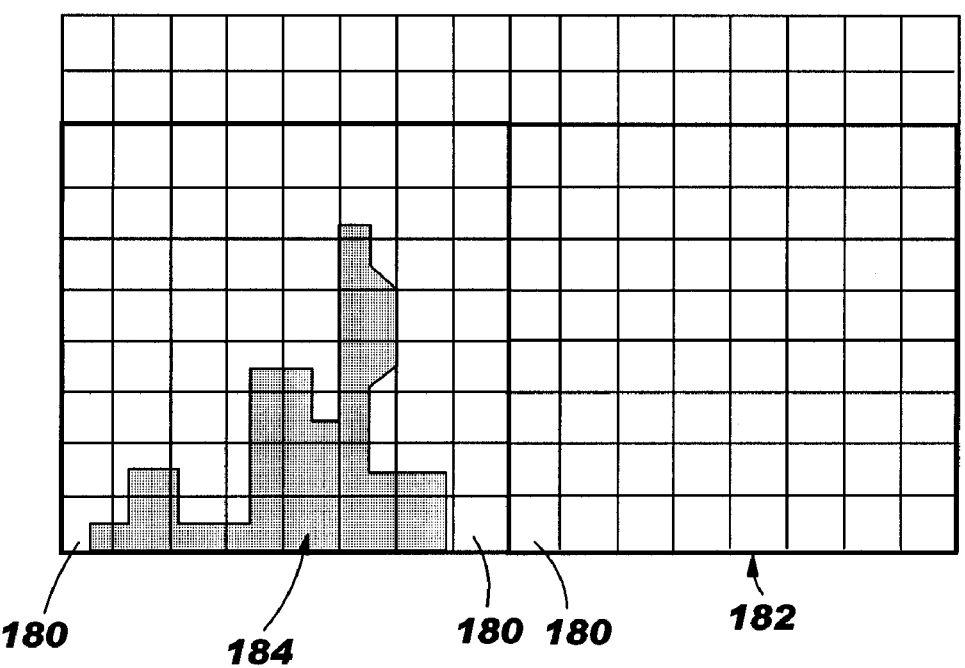
FIG. 5 shows an IC design divided to match the evaluation array.

Turning to FIGS. 3–5, operational methodology of system 100 will now be described. FIG. 3 shows a flow diagram of the methodology, FIG. 4 shows an evaluation array, and FIG. 5 shows an IC design divided to match the evaluation array, as will be described below.

As shown in FIG. 3, in a first step S1, an evaluation array including an array element for each evaluation window of the IC design is established by evaluation array builder 140. As shown in FIG. 4, in one embodiment, evaluation array 160 is a two-dimensional array that includes a plurality of array elements 162. Comparing FIGS. 4 and 5 illustrates that each array element 162 represents a corresponding evaluation window 180 of an IC design 182, only a single target layer of which is shown for clarity. IC design 182 includes a variety of shapes 184. The number of evaluation windows 180 and, hence, the number of array elements 162 is based on a smallest necessary granularity by evaluation array builder 140. In one embodiment, the "smallest necessary granularity" is the smallest evaluation window 180 desired by a user to adequately address processing issues including, for example, processing area, chemical-mechanical polishing limits, IC design 182 size, smallest evaluation window possible, and other issues. For purposes of description, one illustrative evaluation window 180 size is 3×3 μm tile. With this evaluation window 180 size, an IC design 182 that is 20 mm (20,000 μm) on each side would require a 6667×6667 evaluation array 160. Evaluation array 160 is initialized to zeros by array builder 140.

It should be understood that evaluation array builder 140 may establish an evaluation array 160 for an entire IC design 180 or, where parts of an IC design are repeated, may establish an evaluation array 160 for the repetitive part of the IC design only. Density may then be assumed to repeat for those parts not actually evaluated.

In a next step S2, a single pass through shape 184 data for IC design 182 is conducted by IC design evaluator 144. As this occurs, array populator 148 populates each array element 162 with a shape 184 area for a corresponding evaluation window 180, i.e., an area of any shape in a corresponding evaluation window 180. Each global instance of each polygon is cut at the boundaries of an evaluation window 180 it covers and the area of the polygon within that window is added to the total for the corresponding array element 162. The values in FIG. 4 represent illustrative areas in square microns (μm$^2$). To prevent double counting of areas where shapes of an IC design 182 overlap, populator 148 unions disparate polygons within an array element, and tiles disparate trapezoids within an array element similar to a conventional shape processing engine, e.g., Caliber® by Mentor Graphics or Hercules® by Synopsis. The result is an evaluation array 160 that describes the entire IC design 182 at the smallest necessary granularity, e.g., 3×3 μm.

In a next step S3, density checking is conducted by density calculator 152 by iterating over evaluation array 160 using a sub-array 190, as shown in FIG. 4. That is, total shape area within sub-array 190 is divided by the total area of sub-array 190 to calculate a density for sub-array 190. If a density violation occurs, the array element 162 is flagged for analysis. In one embodiment, sub-array 190 is then moved to cover a completely new set of array elements 162, and sub-array 190 is stepped by the size of a whole sub-array 190. In alternative embodiment, sub-array 190 may be stepped by a column of evaluation windows 180. In this case, the process may be quickened considerably by calculating area, for example, by subtracting a first column of evaluation windows from a total, and then adding the next column of evaluation windows, rather than calculating all of them each time.

In one embodiment, sub-array 190 substantially covers a preferred density rule window granularity. That is, sub-array 190 is set to be as close as possible to a density rule window granularity. For example, sub-array 190 may be set to be 24×24 μm or 27×27 μm to be as close as possible to a conventional 25×25 μm window. Preferably, however, each sub-array 190 has a grid size that is a multiple of evaluation window 180 size (i.e., the smallest necessary granularity) to make calculations easier. For the illustrative evaluation window size of a 3×3 μm tile, sub-array 190 would preferably be 3×3 μm, 6×6 μm, 9×9 μm, etc.

The above-described process can also be performed in a conventional nested fashion if the majority of transforms happen to fall on a grid that is an integer multiple or divisor of the stepping frequency. In this case, a sub-array 190 is created for each evaluation window 180, and the window's transform is applied by simply adding the window"s density to the chip"s at the given transform offset.

In the previous discussion, it will be understood that the method steps discussed are performed by a processor, such as PU 104 of system 100, executing instructions of program product 122 stored in memory. It is understood that the various devices, modules, mechanisms and systems described herein may be realized in hardware, software, or a combination of hardware and software, and may be compartmentalized other than as shown. They may be implemented by any type of computer system or other apparatus adapted for carrying out the methods described herein. A typical combination of hardware and software could be a general-purpose computer system with a computer program that, when loaded and executed, controls the computer system such that it carries out the methods described herein. Alternatively, a specific use computer, containing specialized hardware for carrying out one or more of the functional tasks of the invention could be utilized. The present invention can also be embedded in a computer program product, which comprises all the features enabling the implementation of the methods and functions described herein, and which—when loaded in a computer system—is able to carry out these methods and functions. Computer program, software program, program, program product, or software, in the present context mean any expression, in any language, code or notation, of a set of instructions intended to cause a system having an information processing capability to perform a particular function either directly or after the following: (a) conversion to another language, code or notation; and/or (b) reproduction in a different material form.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

The invention claimed is:

1. A method for performing density checking on an integrated circuit (IC) design, the method comprising the steps of:
    establishing an evaluation array including an array element for each evaluation window of the IC design, wherein a number of evaluation windows is based on a smallest necessary granularity;
    performing a single pass through shape data for the IC design to populate each array element with a shape area of a corresponding evaluation window; and
    performing density checking by iterating over the evaluation array using a sub-array.

2. The method of claim 1, wherein the sub-array substantially covers a preferred density rule window granularity.

3. The method of claim 2, wherein each sub-array has a size that is a multiple of the smallest necessary granularity of the evaluation window.

4. The method of claim 1, wherein the populating step includes unioning disparate polygons within an array element.

5. The method of claim 1, wherein the populating step includes tiling disparate trapezoids within an array element.

6. The method of claim 1, wherein the establishing step includes establishing an evaluation array for a repetitive part of the IC design.

7. The method of claim 1, wherein the evaluation array is initialized to zeros.

8. A system for performing density checking on an integrated circuit (IC) design, the system comprising:
    means for establishing an evaluation array including an array element for each evaluation window of the IC design, wherein a number of evaluation windows is based on a smallest necessary granularity;
    means for performing a single pass through shape data for the IC design to populate each array element with a shape area therein; and
    means for performing density checking by iterating over the evaluation array using a sub-array.

9. The system of claim 8, wherein the sub-array substantially covers a preferred density rule window granularity.

10. The system of claim 9, wherein each sub-array has a size that is a multiple of the smallest necessary granularity of the evaluation window.

11. The system of claim 8, wherein the populating means unions disparate polygons within an array element.

12. The system of claim 8, wherein the populating means tiles disparate trapezoids within an array element.

13. The system of claim 8, wherein the establishing means establishes an evaluation array for a repetitive part of the IC design.

14. The system of claim 8, wherein the establishing means initiates each array element to zero.

15. A computer program product comprising a computer useable medium having computer readable program code embodied therein for performing density checking on an integrated circuit (IC) design, the program product comprising:
    program code configured to establish an evaluation array including an array element for each evaluation window of the IC design, wherein a number of evaluation windows is based on a smallest necessary granularity;
    program code configured to perform a single pass through shape data for the IC design to populate each array element with a shape area therein; and
    program code configured to perform density checking by iterating over the evaluation array using a sub-array.

16. The program product of claim 15, wherein the sub-array substantially covers a preferred density rule window granularity.

17. The program product of claim 15, wherein each sub-array has a size that is a multiple of the smallest necessary granularity of the evaluation window.

18. The program product of claim 15, wherein the populating program code unions disparate polygons within an array element.

19. The program product of claim 15, wherein the populating program code tiles disparate trapezoids within an array element.

20. The program product of claim 15, wherein the establishing program code establishes an evaluation array for a repetitive part of the IC design.

* * * * *